United States Patent [19]

Nagao et al.

[11] Patent Number: 4,501,225
[45] Date of Patent: Feb. 26, 1985

[54] APPARATUS FOR MAKING A MAGNETIC RECORDING MEDIUM

[75] Inventors: Makoto Nagao; Akira Nahara; Goro Akashi, all of Odawara, Japan

[73] Assignee: Fuji Photo Film Co., Ltd., Kanagawa, Japan

[21] Appl. No.: 589,701

[22] Filed: Mar. 15, 1984

Related U.S. Application Data

[62] Division of Ser. No. 368,861, Apr. 15, 1982.

[30] Foreign Application Priority Data

Apr. 24, 1981 [JP] Japan ................................. 56-62055

[51] Int. Cl.³ .............................................. C23C 13/08
[52] U.S. Cl. ....................................... 118/718; 118/50; 118/50.1; 118/720; 118/722; 118/724
[58] Field of Search ............................... 427/127–132; 118/718, 50.1, 50, 600, 722, 720, 724

[56] References Cited

U.S. PATENT DOCUMENTS 4,220,117  9/1980  Shinohara ........................ 118/718

FOREIGN PATENT DOCUMENTS 54-125006  9/1979  Japan.

Primary Examiner—Bernard D. Pianalto
Attorney, Agent, or Firm—Gerald J. Ferguson, Jr.; Joseph J. Baker

[57] ABSTRACT

A magnetic metal deposition material contained in a hearth is heated and evaporated in a vacuum to form a flow of vapor, which is then ionized and converged toward a predetermined deposition surface of a flexible substrate. The flexible substrate is moved obliquely downwardly along a convex course by sliding contact with the curved surface of a fixed curved guiding body between a pair of guide rollers located at different heights above the hearth. The fixed curved guiding body communicates with a coolant source for cooling the substrate moving in contact therewith and may be provided with oscillators. Thus a thin film of the magnetic metal is deposited on the convex surface of the substrate.

7 Claims, 2 Drawing Figures

FIG.I
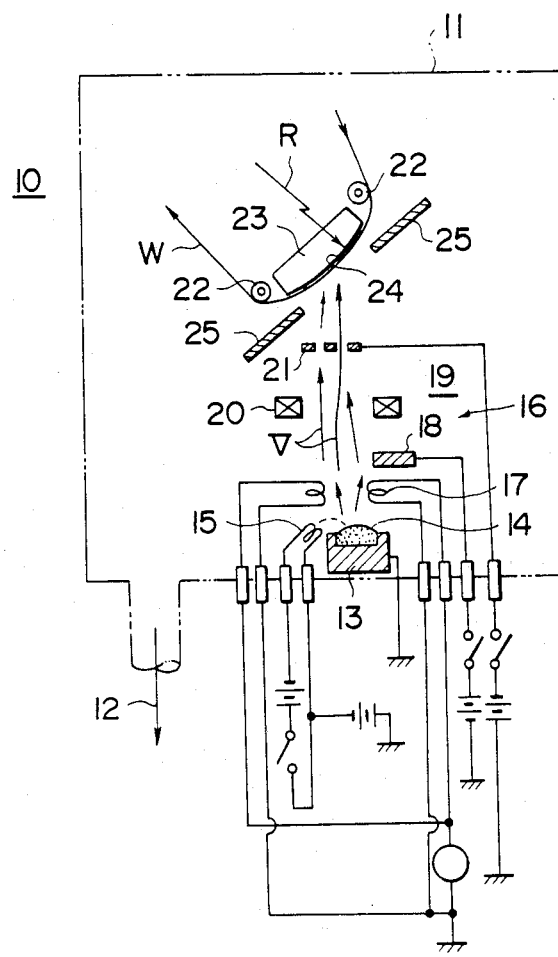
FIG.2
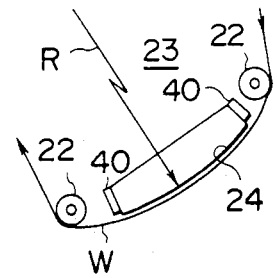

APPARATUS FOR MAKING A MAGNETIC RECORDING MEDIUM

CROSS-REFERENCE OF RELATED APPLICATIONS

This application is a divisional patent application of U.S. Ser. No. 368,861 filed Apr. 15, 1982.

BACKGROUND OF THE INVENTION

1. Field of the Invention

This invention relates to an apparatus for making a non-coating type magnetic recording medium by depositing a thin film such as a magnetic film onto a non-magnetic substrate in a vacuum.

2. Description of the Prior Art

Many of the conventional magnetic recording media are of the so-called coating type and made by using powdered magnetic materials such as magnetic oxide particles and magnetic alloy particles, for example, $\gamma$-$Fe_2O_3$, Co-doped $\gamma$-$Fe_2O_3$, $Fe_3O_4$, Co-doped $Fe_3O_4$, Berthollide compounds of $\gamma$-$Fe_2O_3$ and $Fe_3O_4$, Co-doped Berthollide compounds, $CrO_2$ or the like. These powdered magnetic materials are dispersed in organic binders such as vinyl chloride-vinyl acetate copolymers, styrene-butadiene copolymers, epoxy resins and polyurethane resins. The dispersions thus obtained are then applied in coats on non-magnetic substrates and dried to form the magnetic recording media.

Recently, so-called non-coating type magnetic recording media using no binders have attracted attention because of their sbility to meet strong demand for high density recording. The magnetic recording media of this type have magnetic recording layers which consist on thin ferromagnetic metal films formed by a process such as vacuum deposition, sputtering or ion plating. Thus various efforts are being made to develop non-coating type magnetic recording media suitable for practical use.

To make a non-coating type magnetic recording medium, it has been proposed to vaporize a ferromagnetic metal and cause the resulting vapor stream of the ferromagnetic metal to impinge upon a substrate at an oblique angle, thereby forming a thin film of the ferromagnetic metal on the substrate. This oblique incidence vacuum deposition process is easy to conduct and can form a thin film exhibiting satisfactory magnetic characteristics by use of a relatively small apparatus.

In the conventional oblique incidence vacuum deposition process, a substrate is generally moved along the curved surface of a cylindrical cooling can positioned above the material to be evaporated and deposited. The vapor stream of the deposition metal material is caused to impinge upon the substrate at an extremely limited angle of incidence with respect to the substrate surface, thereby forming a thin ferromagnetic metal film on the substrate to a predetermined thickness. However, because the metal vapor stream is at an oblique angle with respect to the surface of the substrate, the thickness of the deposited thin film equals the product of the cosine of the angle of incidence and the thickness obtained when the angle of incidence of the vapor stream is zero, namely when the vapor stream impinges normal to the surface of the substrate. Accordingly, the deposition efficiency considerably drops as the angle of incidence of the vapor stream increases. Further, because of the geometrical arrangement of the substrate and the deposition material, the distance therebetween increases as the angle of incidence of the vapor stream increases, resulting in a still lower deposition efficiency. Furthermore, because the magnetic characteristics of the deposited film depend upon the angle of incidence (refer to Schuede: J.A.P. 35, 2558, 1964), it is necessary to minimize the angle of incidence as much as practicable and keep it approximately constant.

As described above, the conventional oblique incidence vacuum deposition process presents a very real problem with regard to the drop in the deposition efficiency, which leads to a rise in the production cost. This problem is aggravated particularly when a relatively expensive nonferrous metal such as Co, Co alloy or the like is used.

To solve the above mentioned problem, it has been proposed in Japanese unexamined Patent Publication No. 54 (1979)-12547 to locate a deposition material heated to a high temperature at a position transversely shifted from the center line of a cylindrical cooling can through which cooling water (usually at normal temperature) is passed. A substrate is moved along the curved surface of the cylindrical cooling can, and only the high-density portion of the vapor stream of the deposition metal is caused to impinge upon the curved surface of the flexible substrate. This method can give a deposition efficiency of about 20%.

With this method, to increase the effective deposition area upon which the high-density portion of the vapor stream impinges, it is necessary to increase the outer diameter of the cylindrical cooling can. However, increasing the outer diameter of the can naturally increase the size of the whole apparatus, resulting in higher equipment cost and greater maintenance requirements.

As disclosed in Japanese unexamined Patent Publication No. 53(1978)-95604, an attempt has also been made to remove the aforesaid cylindrical cooling can and use a plurality of guide rollers for guiding the substrate so that the substrate moves along a straight (not a curved) course between adjacent pairs of the guide rollers at an oblique angle with respect to the deposition material located below the guide rollers. The vapor stream of the deposition material is caused to impinge upon the straight surface of the substrate.

The method just described above can be conducted by use of a relatively small apparatus and can form a thin metal film at a high deposition efficiency. With this method, however, it is impossible to cool the substrate, which is heated by the deposition material heated for evaporation and the vapor stream generated. Accordingly, the deposition surface tends to develop wrinkles, greatly affecting the uniformity of the thickness of the deposited film and the smooth movement of the substrate.

SUMMARY OF THE INVENTION

The primary object of the present invention is to provide an apparatus for making a non-coating type magnetic recording medium, which is relatively compact in construction and can form a uniform thin film on a substrate at a high deposition efficiency.

The specific object of the present invention is to provide an apparatus for economically making a non-coating type magnetic recording medium exhibiting excellent magnetic characteristics.

The apparatus for making a magnetic recording meidum in accordance with the present invention comprises, in a vacuum, a means for heating and evaporating a deposition material, a hearth for containing said deposition material, a pair of guide rollers located at different heights above said hearth, and a fixed curved guiding means having a curved surface which is convex downwardly and capable of maintaining a flexible substrate moved between said pair of guide rollers in sliding contact therewith.

BRIEF DESCRIPTION OF THE DRAWINGS

FIG. 1 is an explanatory view showing the major sections of an embodiment of the apparatus in accordance with the present invention, and FIG. 2 is a sectional view showing a major section of another embodiment of the apparatus in accordance with the present invention.

DESCRIPTION OF PREFERRED EMBODIMENTS

The present invention will hereinbelow be described in further detail with reference to the accompanying drawings.

FIG. 1 shows an embodiment of the major sections of the apparatus 10 in accordance with the present invention.

In FIG. 1, a casing 11 is connected with an evacuating system 12 and kept at a desired level of internal vacuum generally within the range of about $10^{-2}$ to $10^{-8}$ Torr. In the casing 11 is positioned an open type hearth 13 made of a known material such as W, Ta, C, Cu, Mo, $Al_2O_3$, BN, or the like. The open type hearth 13 contains a deposition material 14 consisting of a magnetic material, for example, a metal such as Fe, Co, Ni or the like or ferromagnetic alloy such as Fe-Co, Fe-Ni, Co-Ni, Fe-Co-Ni, Fe-Rh, Fe-Cu, Co-Cu, Co-Au, Co-Y, Co-La, Co-Pr, Co-Gd, Co-Sm, Co-Pt, Ni-Cu, Mn-Bi, Mn-Sb, Mn-Al, Fe-Cr, Co-Cr, Ni-Cr, Fe-Co-Cr, Fe-Co-Ni-Cr or the like.

In the vicinity of the hearth 13 is positioned a deposition material heating means 15 of the type using an electron beam.

The hearth 13 shown in FIG. 1 is of the open type having an upper opening through which the deposition material 14 can evaporate over a relatively wide region. However, it is also possible to use a closed type hearth in which the area of evaporation point is limited by a relatively small opening.

Further, the deposition material heating means 15 may be of any other known system, for example, a resistance heating system, high-frequency induction heating system or the like, instead of the electron beam heating system.

Above the deposition material 14 is positioned an ionization enhancing means 16. This means 16 is used because, only with the heating means 15, the proportion of vapor ionized in the vapor flow is extremely low (for example, 10% or less of the whole vapor flow). This is true for all types of heating means.

The ionization enhancing means 16 consists of a thermoelectron source 17 and an ionization electrode 18. The thermoelectron source 17 is a spiralled or linear bar-shaped filament made of a high-melting-point material such as W, Ta, Mo, an alloy containing these or the like, to which a d.c. or a.c. voltage is applied to cause emission of thermoelectrons therefrom.

In case the deposition material heating means 15 is of the electron beam heating system, the thermoelectron source 17 is located as near to the evaporation surface of the deposition material 14 as possible without interfering with the passage of the electron beam (shown by the dotted line in FIG. 1) emitted from the deposition material heating means 15. Further, the thermoelectron source 17 is positioned at the boundary of slightly inside the vapor flow V.

When the deposition material heating means 15 is of a system other than the electron beam heating system, the thermoelectron source 17 may be shifted even closer to the deposition material 14.

The ionization electrode 18 is bar, plain plate or ring shaped, and is made of a conductive material such as Ag, Cu, W, Ta, Mo, stainless steel or the like. It is positioned in the vicinity of and above the thermoelectron source 17, so that it does not greatly obstruct the flow of vapor V. A d.c. or a.c. voltage is applied to the ionization electrode 18.

An ion beam converging means 19 is positioned between the ionization enhancing means 16 and a plurality of guide rollers 22 rotatably supported above the ionization enhancing means 16. This ion beam converging means 19 consists of a convergency assisting coil 20 and a converging electrode 21 to which a d.c. or a.c. current is applied.

The convergency assisting coil 20 prevents the flow of vapor V, which generally exhibits $Cos^n$ distribution, from spreading beyond the predetermined region of deposition and deflects or directs the center of the flow of vapor V to the center of the predetermined region of deposition above the ionization electrode 18.

The converging electrode 21 serves to converge the ion beam and is positioned above the convergency assisting coil 20 and in the vicinity of the path of the substrate W, which is defined by the guide rollers 22 and a fixed curved guiding means 23. The converging electrode 21 is made of a high-melting-point material such as W, Ta, Mo, stainless steel or the like, and applied with a negative potential.

The fixed curved guiding means 23 is positioned and fixed between a pair of guide rollers 22 so as to guide the substrate W along a convex, obliquely downward course between a pair of guide rollers 22 located at heights different from each other.

The body of the fixed curved guiding means 23 is made of stainless steel, copper or the like, and the convex surface 24 thereof over which the substrate W moves is covered with a lubricant layer formed of teflon, silicone resin, ceramic or the like, generally in a thickness of about 10 $\mu$m.

The radius of curvature R of the curved surface 24 may be altered appropriately depending on the distance between it and the deposition material 14 and a desired angle of incidence of the flow of vapor V. Generally, the curvature radius R is set to a value within the range of from about 20 to 200 cm. (To improve the coercive force of the magnetic recording medium, it is preferable that the angle of incidence of the flow of vapor V be about 45° or more.)

The fixed curved guiding means 23 is constructed so that cooling water can be passed through its body to cool the substrate W in contact with the curved surface 24.

A mask 25 is positioned below the curved surface 24 so as to prevent the flow of vapor V from being deposited onto the lower surface of the substrate W at an improper angle.

When operating the apparatus 10 of the present invention shown in FIG. 1, the interior of the casing 11 is first evacuated and kept at a desired level of vacuum within the range of $10^{-2}$ to $10^{-8}$ Torr by the evacuating system 12. Then the deposition material heating means 15 is switched on to continuously heat the deposition material 14 contained in the hearth 13. As a result, the deposition material 14 gradually evaporates from its evaporation surface and forms the flow of vapor V of metal particles. In the course of evaporation, a very small portion of the metal particles in the vapor is ionized and diverges upwardly exhibiting approximately a $Cos^n$ distribution together with the other portions of the metal particles.

Thereafter, in the vicinity of the deposition material 14 where the flow of vapor V has not yet expanded so much, the flow of vapor V effectively impinges against the thermoelectrons which are emitted from the heated thermoelectron source 17 and which are adequately controlled in movement by the ionization electrode 18. In this way, the vapor particles are efficiently ionized (positively). It is also possible to position the ionization electrode 18 below the thermoelectron source 17, reversely to the arrangement shown in FIG. 1, without adversely affecting the rate of ionization. The vertical positions of these members 17, 18 may be determined appropriately according to the desired layout conditions and the heating system employed.

The voltage applied to the ionization electrode 18 is generally within the range of 30 V to 500 V. Inadequate voltages detrimentally affect the rate of ionization.

The flow of vapor V effectively ionized into an ion beam by the ionization enhancing means 16 is then converged by the ion beam converging means 19. This is done to prevent the whole flow of vapor V from excessively expanding and moving at non-uniform angles of incidence with respect to the surface of the substrate W, thereby to attain an improved deposition efficiency and improved magnetic characteristics of the magnetic recording medium.

When passing through the opening of the convergency assisting coil 20 applied with a positive d.c. voltage in the range of 100 V to 2 kV, the evaporation distribution of the ion beam V is greatly converged, and the center thereof is deflected by the center of the opening of the coil 20.

In case where the clearance or the deflection between the predetermined region of deposition on the substrate W and the deposition material 14 is relatively small, it is possible to eliminate the convergency assisting coil 20. Where the clearance or the deflection therebetween is considerably large, it is possible to arrange a plurality of convergency assisting coils 20 one above another and to decrease the voltage applied thereto or to apply a negative voltage to some of them for the purpose of decelerating or converging the ion beam V.

Thereafter, the ion beam V passed through the convergency assisting coil 20 is finally converged and directed at a desired angle of incidence with respect to the substrate W by the converging electrode 21 positioned in the vicinity of the predetermined region of deposition on the substrate W so as not to deviate therefrom. Thus the ion beam V passes through the spaces in the network of the converging electrode 21, and then deposits on the surface of the substrate W convexly curved in the obliquely downward direction.

To obtain a deposited film with improved coercive force, it is preferred that the angle of incidence of the ion beam V with respect to the deposition surface of the substrate W be about 45° or more. This can be achieved by appropriately setting the inclination and the radius of curvature of the curved surface 24 with reference to the movement direction of the substrate W and the mounting position (particularly, the center) of the ion beam converging means 19.

It is also possible to adopt a ring-shaped or bar-shaped convergency assisting electrode in place of the convergency assisting coil 20.

The voltage applied to the converging electrode 21 generally set to a value between $-100$ V and $-3,000$ V. Inadequate voltages applied to the electrode 21 adversely affect the speed of the ion beam V, resulting in a very low converging effect and sputtering of the deposited film.

In the embodiment shown in FIG. 1, the converging electrode 21 is positioned below the lower side of the substrate W. However, depending on the desired layout of components in the casing 11, a ring-shaped or plate-shaped electrode 21 may be positioned in the vicinity of the upper surface of the substrate W or such electrodes may be arranged on both sides of the substrate W.

FIG. 2 shows another embodiment of the fixed curved guiding means 23 used in the apparatus in accordance with the present invention. In FIG. 2, both ends of the body of the fixed curved guiding means 23 and fixed to known magnetostriction type, electrostriction type, piezoelectric type or electromagnetic type oscillators 40 and finely oscillated radially of the curved surface 24. Such fine oscillation changes or reduces the friction between the curved surface 24 and the substrate W sliding thereon, thereby reducing the occurrence of scratches on the substrate W. In this case, smooth movement of the substrate 24 can be accomplished even without the lubricant layer thereon.

The curved surface 24 may also be oscillated in its circumferential direction, instead of in the radial direction thereof.

In the embodiment shown in FIG. 2, the oscillators 40 are located on both sides of the fixed curved guiding means 23. However, they may be embedded on or in the curved surface 24, or more than two oscillators 40 may be used to form an undulating guiding surface. Alternatively, the oscillators 40 may be mounted on the body of the fixed curved guiding means 23 on the side opposite to the curved surface 24.

The curved surface 24 may be roughed to a surface roughness of up to about 25S without adversely affecting the surface smoothness and movement of the substrate W.

The substrate W may be a plastic film made of polyethylene terephthalate, polyimide, polyamide, polyvinyl chloride, cellulose triacetate, polycarbonate, polyethylene naphthalate or the like.

The thickness of the magnetic film formed on the substrate W is generally selected within the range of between about 0.02 $\mu$m and 5.0 $\mu$m, preferably between 0.05 $\mu$m and 2.0 $\mu$m, to provide a sufficient electromagnetic output and allow high density recording.

As described above, in the present invention, the substrate W is guided and moved obliquely downward along a convex course between pair of guide rollers 22 by use of the fixed curved guiding means 23 having the fixed curved surface 24 capable of being cooled. Accordingly, a greater proportion of the flow of vapor V can be deposited on the substrate W at the desired angle of incidence than is possible when the substrate W moves simply obliquely. This results in a magnetic recording medium exhibiting a higher coercive force. Further, in accordance with the present invention, it is possible to prevent the substrate W from deteriorating due to heat.

Further, the fixed curved guiding means 23 can be constructed smaller than the cooling can used in the conventional apparatus. This feature of the present invention greatly reduces space requirements and thus is extremely advantageous with regard to equipment cost and maintenance.

It should be understood that the fixed curved guiding means 23 used in the present invention can exhibit the above-mentioned novel effects even when adopted in a deposition apparatus having no ionization enhancing means 16, ion beam converging means 19 or the like.

We claim:

1. An apparatus for making a magnetic recording medium at least comprising, in a vacuum, a means for heating and evaporating a deposition material, a hearth for containing said deposition material, a pair of guide rollers located at different heights above said hearth, and a fixed curved guiding means having a curved surface which is convex downwardly and capable of slidably guiding a flexible substrate moved in contact therewith between said pair of guide rollers, said fixed curved guiding means being provided with oscillators.

2. An apparatus as defined in claim 1 wherein the inside of the body of said fixed curved guiding means communicates with a coolant source.

3. An apparatus as defined in claim 2 further comprising an ion beam converging means for converging the flow of ionized vapor.

4. An apparatus as defined in claim 1 wherein the curved surface of said fixed curved guiding means has a surface roughness of 25S or less.

5. An apparatus as defined in claim 1 wherein the curved surface of said fixed curved guiding means is covered with a lubricant layer.

6. An apparatus as defined in claim 1 further comprising an ionization enhancing means for ionizing the flow of vapor of said deposition material.

7. An apparatus for making a magnetic recording medium at least comprising, in a vacuum, a means for heating and evaporating a deposition material, a hearth for containing said deposition material, a pair of guide rollers located at different heights above said hearth, and a fixed curved guiding means having a body with a curved surface which is convex downwardly and capable of slidably guiding a flexible substrate moved in contact therewith between said pair of guide rollers, the inside of said body of said fixed curved guiding means communicating with a coolant surface, said fixed curved guiding means being provided with oscillators.

* * * * *